United States Patent
Steingart et al.

(10) Patent No.: US 8,125,214 B1
(45) Date of Patent: Feb. 28, 2012

(54) DETERMINING ELECTRICAL CURRENT USING AT LEAST TWO SENSORS AT A KNOWN DISTANCE FROM EACH OTHER

(76) Inventors: Daniel Artemus Steingart, New York, NY (US); James Williams Evans, Piedmont, CA (US)

( * ) Notice: Subject to any disclaimer, the term of this patent is extended or adjusted under 35 U.S.C. 154(b) by 253 days.

(21) Appl. No.: 12/378,127

(22) Filed: Feb. 11, 2009

Related U.S. Application Data

(60) Provisional application No. 61/027,932, filed on Feb. 12, 2008.

(51) Int. Cl.
*G01R 15/20* (2006.01)

(52) U.S. Cl. .................. 324/117 H; 324/117 R; 324/127

(58) Field of Classification Search .................. None
See application file for complete search history.

(56) References Cited

U.S. PATENT DOCUMENTS 4,887,027 A * 12/1989 Strasser .................. 324/117 H
(Continued)

*Primary Examiner* — Minh N Tang
(74) *Attorney, Agent, or Firm* — Adams Law Office; Sharon Adams

(57) ABSTRACT

The invention relates to methods and devices for accurately monitoring the electrical current in electrolytic cells used to produce metals, including but not limited to aluminum, or other chemical substances. A plurality of sensors are placed at some distance from the conductor, with at least two sensors at a known distance from each other. Measurements from the plurality of sensors are used to calculate the electrical current.

16 Claims, 2 Drawing Sheets

U.S. PATENT DOCUMENTS 6,136,177 A 10/2000 Hung
6,731,105 B1 * 5/2004 Hoyle et al. ............ 324/117 R
7,470,356 B2 * 12/2008 You et al. .................. 205/574

* cited by examiner

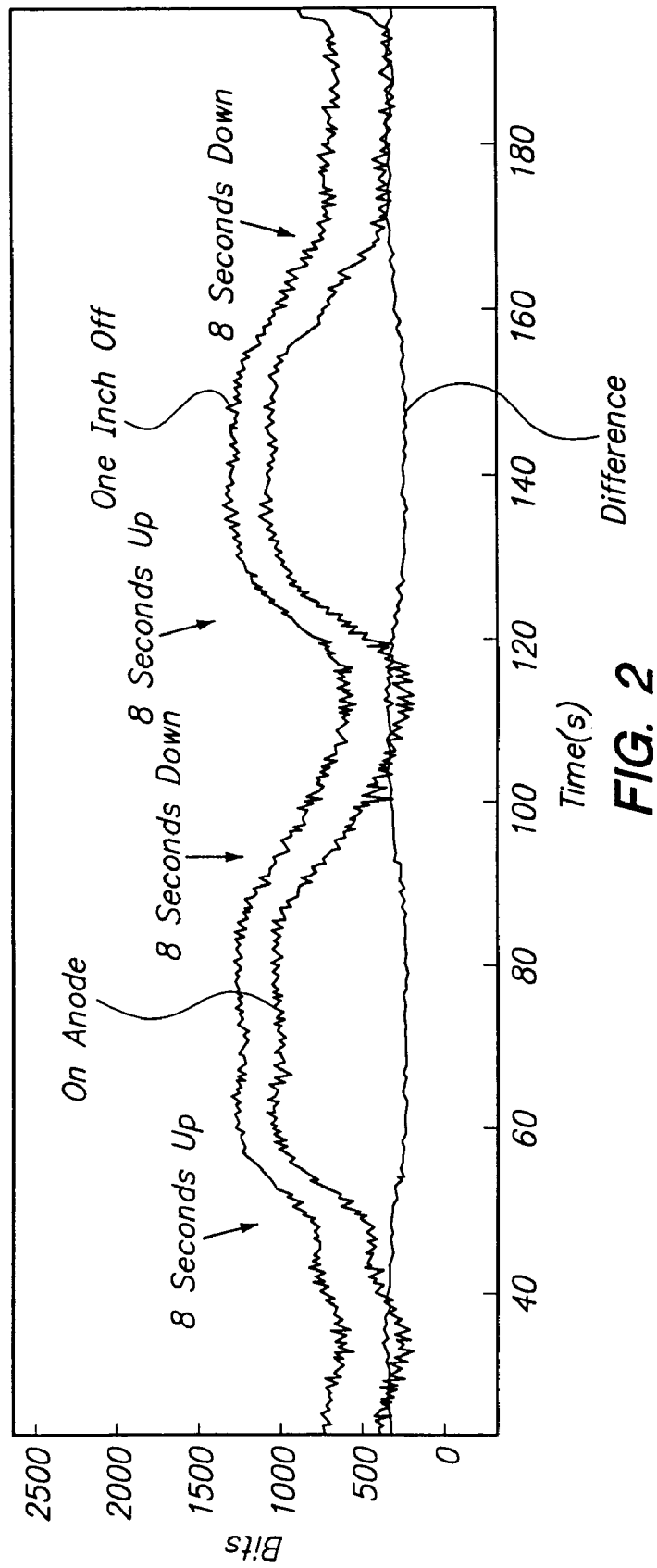

Figure 2. Results of measurements of the electrical current flowing in an anode rod of an alumina reduction cell made by the multiple sensor method of the present invention; the electrical current is determined from the difference between sensor signals. Measurements made over approximately three minutes wherein the electrical current was changed by activating the anode raising/lowering motor at the times and durations indicated.

DETERMINING ELECTRICAL CURRENT USING AT LEAST TWO SENSORS AT A KNOWN DISTANCE FROM EACH OTHER

CROSS REFERENCE TO RELATED APPLICATIONS

This application claims priority to U.S. Provisional Patent Application 61/027,932, filed on Feb. 12, 2008, which is hereby incorporated by reference in its entirety.

BACKGROUND OF THE INVENTION

1. Field of the Invention

The invention relates to methods and devices for accurately monitoring the electrical current in electrolytic cells used to produce aluminum, other metals, or other chemical substances.

2. Description of the Related Art

Within industry there is an increasing need to accurately measure electrical currents and other electrical variables so as to control electrical equipment for the purposes of improving productivity or efficiency, enhancing safety and related objectives.

The production of many important materials and chemical substances such as aluminum, copper, zinc, chlorine and caustic soda is carried out within industry using electrolytic cells wherein a large direct electrical current (DC) is passed through the cell so as to bring about electrochemical reactions that produce the desired materials. In many cases the distribution of the electrical current within parts of the cell, or the variation of electrical current due to phenomena occurring in the cell, has an effect on process efficiency. In many cases the cost and difficulty of making measurements of electrical current and electrical current distribution within the cell preclude such measurements and opportunities for improvement of cell performance are unrealized.

Representative of these industries is the aluminum industry. The table below compares the electrical energy consumption of the world's aluminum industry with that of several countries. Clearly the electrical energy consumed by this industry is enormous and yet the efficiency of use of this energy is poor. Approximately 55% of the electrical energy entering an aluminum smelter becomes waste heat and only 45% is gainfully used to complete the necessary electrochemical reactions in electrochemical cells.

The industry also has a large carbon footprint. The production of each ton of aluminum by a cathodic reaction is accompanied by the production of 1.2 tons of $CO_2$ by the anodic consumption of carbon anodes used in the process. Additional $CO_2$, about 0.4 tons, is produced in the baking furnaces making the anodes. Furthermore, the cells suffer from periodic upsets called "anode effects" which cause emission of fluorinated hydrocarbons (PFCs) with pernicious global warming potential so that PFC emissions add approximately one ton of $CO_2$ equivalents, bringing the total emissions to the order of 2.6 tons of $CO_2$ equivalents per ton of aluminum. $CO_2$ emissions at the power plants supplying the electricity might be included in any rational assessment of the carbon footprint of aluminum smelting. This would depend on the mix of power generation technology: zero for hydro, solar or nuclear, but up to 8 tons $CO_2$ per ton of aluminum at coal burning plants. There are approximately 200 aluminum smelters around the world producing a total of approximately 40 million metric tons of metal per year. Consequently the worldwide carbon footprint is in the range 104-424 million metric tons $CO_2$ equivalents per year. Thus, the ability to accurately monitor electrolytic cells could significantly reduce the $CO_2$ output from aluminum production.

| Electrical energy consumption (gigaWatt hours) 2007 (source CIA Factbook) | | |
|---|---|---|
| 1 | United States | 3,717,000 |
| 2 | China | 2,494,000 |
| 3 | Japan | 946,300 |
| 4 | Russia | 940,000 |
| 5 | India | 587,900 |
|   | Aluminum Smelters | 548,896 |
| 6 | Germany | 524,600 |
| 7 | Canada | 522,400 |
| 8 | France | 482,400 |

Determining an electrical current by measuring the magnetic field has been known since at least the beginning of the twentieth century. However, existing techniques for monitoring and measuring these magnetic fields are often inadequate for rapid, accurate monitoring.

It is known that one or more sensors may be used to determine the electrical current distribution in alumina reduction cells, commonly used in the production of aluminum, by measuring magnetic fields. Existing techniques may rely on measurements from differential signals from multiple sensors, or may rely on multiple sensor measurements to create an average measurement. However, these techniques have inaccuracies due to sensor calibration and temperature drift. In operation of a Hall-Héroult electrolytic cell anodes must be changed periodically. The used anode and anode rod must be removed and replaced with a new anode and anode rod. This necessarily effects the sensor calibration, and thus error is inevitably introduced whenever anodes are changed.

Existing techniques generally place multiple sensors adjacent to the conductor, potentially subjecting the sensors to changing and extreme temperatures. Extreme temperatures or temperature changes interferes with the sensors ability to provide accurate measurements.

Better measurement of process parameters (voltage, electrical current, temperature, etc.) leads to improvement in the performance of such production technologies whereby energy efficiency can be improved and carbon footprint reduced.

Thus, there exists a need to more accurately measure electrical fields in electrolytic cells by reducing the errors and inaccuracies in present-day measuring techniques. The present invention is an improved method of measuring large electrical currents found in such industries. The sensors used in the present invention are not in contact with the anode, and therefore provide consistent, accurate measurements even when anode changing is needed.

BRIEF SUMMARY OF THE INVENTION

The invention permits electrical current measurement by precise placement of at least two sensors with respect to each other, but without requiring precise placement of the sensors with respect to a conductor.

Two or more sensors for magnetic fields are mounted, at a known distance from each other, near a conductor carrying electrical current. Each sensor measures the magnetic field produced by the electrical current. The sensor measurements are transmitted to signal processing and transmission electronics. The magnitude of the electrical current is calculated based on the different output of the sensors and the known distance between at least two sensors. The measurements or calculated electrical current are transmitted through known methods to a receiving device. Electrical power is supplied to power the sensors and the methods of transmission.

One embodiment of the invention consists of at least two Hall effect sensors that are connected to a wireless transceiver so as to transmit the respective sensor signals to a second, receiving wireless transceiver that is connected to a computer. Calculation of the electrical current in the conductor proximate to the sensors is carried out at the computer. In this embodiment the power needed for the sensors and the wireless transceiver is supplied by batteries.

Another embodiment has two or more sensors capable of measuring magnetic fields so disposed that the sensors measure the magnetic field components generated by an electrical current in a nearby conductor, in a manner that permits the determination of that electrical current from differences, ratios and other mathematical functions of the two or more measurements, and a means for transmitting the values of the magnetic field components to a means for relaying, recording or displaying the value of fields.

In another embodiment, the means for relaying, recording or displaying the values computes the electrical current from the measured field values, wherein the means for relaying, recording or displaying the values is a wireless transceiver.

In another embodiment, the means for relaying, recording or displaying the values also displays or records the electrical current.

Another embodiment provides the needed power by a thermoelectric generator connected to the sensors and transceiver.

Another embodiment transmits the sensor signals to a receiving device using signal wires.

Another embodiment includes calculation, from the sensor signals, of the electrical current in the proximate conductor by the wireless transceiver to which the sensors are attached, followed by wireless transmission of the value of the electrical current to the receiving transceiver.

In another embodiment, the electrical power to the device is provided by electrical connections to the conductor and one other conductor at a different voltage.

In another embodiment, the electrical power is provided by electrical connections to second and third conductors lying on the electrical current path to or from the first conductor.

DESCRIPTION OF THE DRAWINGS

FIG. 2 shows the output of sensors in an alumina reduction cell in an aluminum smelter, where the sensors are placed at a known distance from each other, and intended to measure the electrical current in said conductor.

DETAILED DESCRIPTION OF THE INVENTION

Figure 1:
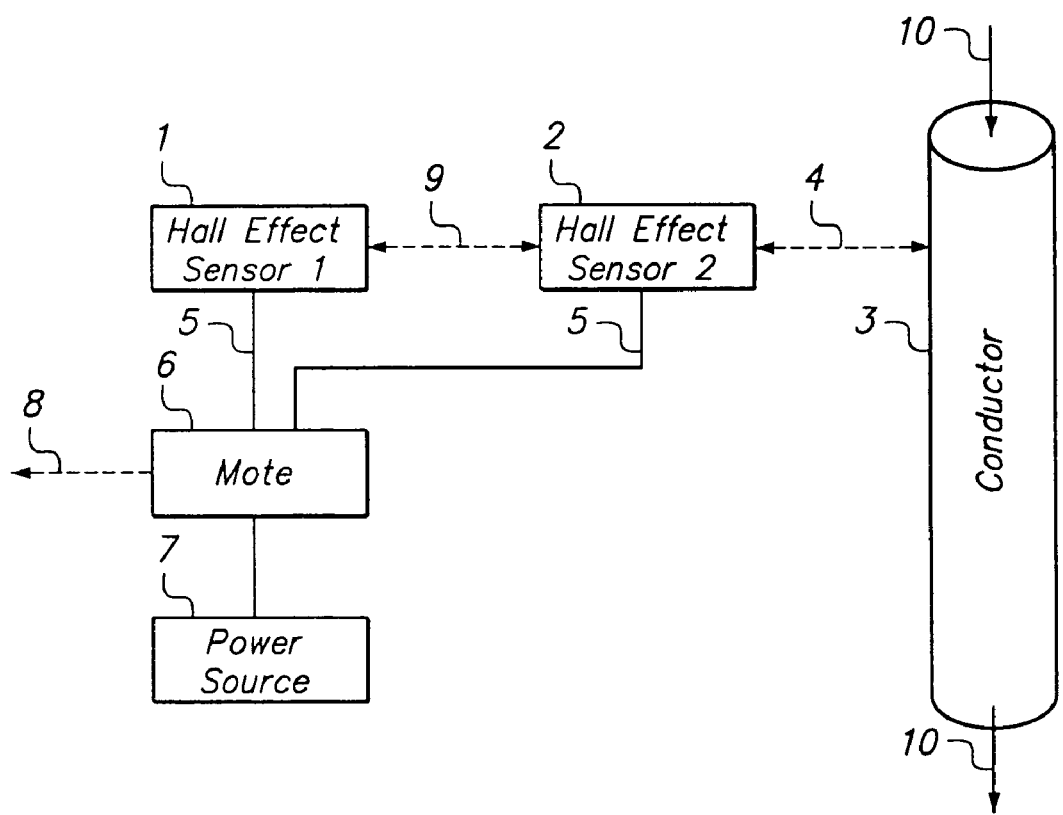
FIG. 1 illustrates one embodiment of sensor configuration, conductor, attached wireless transceiver and receiving transceiver.

FIG. 1 illustrates schematically the arrangement of the various components of one embodiment of the invention. A first Hall effect sensor 1 is placed near, but not contiguous to, conductor 3. The first sensor 1 may be at any distance from conductor 3 as long as it is close enough to measure the magnetic field generated by the flow of electrical current 10 in conductor 3, thereby yielding a first measurement. In FIG. 1, the first sensor is located at the sum of known distance 9 and length 4 from conductor 3.

A second Hall effect sensor 2 is placed between conductor 3 and first sensor 1, at a known distance 9 from the first sensor 1, and at length 4 from conductor 3. The second sensor is also not contiguous to the conductor, and is close enough to the conductor to measure the magnetic field generated by the flow of electrical current 10 in conductor 3, thereby yielding a second measurement. Thus, second sensor 2 is closer to conductor 3 than first sensor 1. The first and second measurements are transmitted as signals to a mote 6. In FIG. 1, the measurements from the two sensors are transmitted by wires 5 to mote 6. In one embodiment, shown in FIG. 1, mote 6 is capable of processing the measurements and transmitting these processed measurements as data 8. Mote 6 is powered by power source 7.

Mote 6 has a variety of embodiments. Mote 6 may be small, wireless computer capable of processing and analyzing the measurements from the sensors, and calculating the electrical field directly. In this embodiment, mote 6 calculates the electrical current and transmits this data 8. In another embodiment, mote 6 is a wireless transceiver capable of doing only a limited analysis of the sensor measurements, such as simple averaging, and then wirelessly transmitting this data 8 to a receiver (not shown) connected to a computer (also not shown) for further analysis.

Conductor 3 is shown as a cylinder, however the invention is not restricted to cylindrical conductors, and can be used with any conductor shape. Electrical current 10 is shown, in FIG. 1, as flowing from top to bottom of conductor 3. However, the invention is equally applicable when the electrical current flows from bottom to top. The invention is equally applicable when the conductor is disposed other than vertically and when the electrical current flows in either direction along the conductor.

In one embodiment, power source 7 is a battery providing power to signal processing and transmission electronics 6 and to the Hall effect sensors 1 and 2. In other embodiments the power source for signal processing and transmission electronics 6 and sensors 1 and 2 is a thermoelectric generator similarly connected. In the embodiment shown in FIG. 1, power is supplied to sensors 1 and 2 via the signal processing and transmission electronics, or mote, 6 but in other embodiments the power is supplied directly from power source 7 to sensors 1 and 2, as well as to the signal processing and transmission electronics, or mote, 6. In yet another embodiment of the invention the power source 7 is a power socket such as found in the walls of industrial, commercial and other buildings. Other arrangements of sensing, computing and communicating parts will be evident to those skilled in the art. One example is the use of a separate wireless transceiver to communicate the measurements to the receiving device.

It is known that the magnetic field at the first sensor 1 is dependent on the electrical current 10 in the conductor 3. The magnetic field at first sensor 1 is also dependent on the placement of sensor 1 with respect to the conductor, i.e. on the distance 4+9 between sensor 1 and conductor 3. Consequently, if a single sensor is to be relied on to yield a measurement of electrical current, the sensor must be exactly positioned with respect to the conductor. In many industrial applications this positioning cannot be maintained exactly. In fact, in many applications this separation is not precisely known.

In the present invention a second sensor 2 is placed an exactly known distance 9 from the first sensor 1. The magnetic field at the second sensor 2 is also dependent on the electrical current in the conductor 3, and on the distance 4 between sensor 2 and conductor 3.

A first measurement from sensor 1 and a second measurement from sensor 2 are transmitted to mote 6. The first and second measurements are used to determine the electrical current from differences, ratios and other mathematical functions of the two (or more) measurements. Because the separation between sensors 1 and 2 is known distance 9, the electrical current 10 flowing in conductor 3 may be calculated from the two measurements from sensors 1 and 2, almost irrespective of length 4. The first and second measurements are used in a software model of the magnetic field, which calculates the electrical current taking into account the known distance. This is an expolation of the Maxwell-Ampere relation, but since there are multiple conductors in proximity our models account for superposition of fields.

Therefore the present invention permits electrical current measurement without precise placement of measuring sensors with respect to the conductor. The multiple sensors are readily permanently and precisely fixed with respect to each other, for example by mounting them on the same printed circuit board.

In the embodiment depicted schematically in FIG. 1 the measurement of electrical current is only slightly affected by displacement of the conductor out of (or into) the plane of the figure. If such displacement is larger, then incorporation of a third (or more) sensors, placed out of the plane of the figure, permits allowance for such displacement in the calculation of the electrical current.

The invention can be adapted for use in many industrial and commercial processes. Examples include the measurement of electrical current distribution among the anodes of the alumina reduction cells (known in industry as Hall-Héroult cells or as Hall cells) used to produce aluminum in an aluminum smelter, similar measurements of electrical current distribution among electrodes in the cells used for producing copper, nickel, zinc, lead (and other non-ferrous metals) and electrical current distributions in cells producing chlorine and caustic soda (known in industry as chlor-alkali cells). Applications in other electrochemical industries will be obvious to those skilled in the art.

In applications where multiple electrical currents are to be measured then each electrical current would be measured using at least two of the magnetic field sensors as depicted in FIG. 1.

FIG. 2 is a plot of the results of measurements of the electrical current flowing in an anode rod of Hall-Héroult cell using two sensors, according to one embodiment of the invention, over a period of approximately three minutes. "Bits" refers to the digitized sensor signals received by the computer and decreases as the magnetic field detected by a sensor increases. The electrical current is determined from the difference between the two digitized sensor signals and this too is plotted. "On anode" refers to second sensor 2, which is closer to the anode rod. "One inch Off" refers to first sensor 1 that, in this case, is one inch away from second sensor 2.

In Hall-Héroult cells the electrical current in an anode and its rod can be changed by raising or lowering the anode (with other anodes in essentially unchanged positions). FIG. 2 shows that at approximately 50 seconds the electrical current 10 in the anode rod was decreased by activating, for eight seconds, a motor for raising the anode, thereby reducing the magnetic field produced by the electrical current 10. This increased the Bits observed at the computer for both sensors 1 and 2. Significantly, a reduction in Bits (increased electrical current and magnetic field) by activating the motor to drive the anode down at approximately 90 seconds is evident. A repeat of the upward movement (starting at 120 seconds) and downward movement (160 seconds) duplicated the results of the earlier movements showing the effect on the difference of the digitized signal from the two sensors that is central to the invention.

The efficacy of using at least two magnetic field sensors in measurement of electrical current, rather than only one, is exemplified in Table 2. Therein lie results obtained by application of the Bio-Savart law of physics to the determination of magnetic fields around a conductor carrying an electrical current. The conductor is square (150 mm by 150 mm) in cross section and sufficiently long that "end effects" are inconsequential. A first sensor is placed near the center of one face a distance Y from the center of that face (results being provided in the table for Y=130, 180 or 230 mm). A second sensor is placed a known distance 9 from the first sensor, where in this case, known distance 9 is 15 mm. Thus, second sensor 2 is 15 mm further from the conductor 3 than first sensor 1.

The sensors are assumed to be precisely calibrated so that they accurately report a magnetic field component (in this case a component parallel to the nearby conductor face) at the position where they are located. It is then supposed that the sensor (or sensor pair) or the conductor are misplaced so that Y is inadvertently increased by 15 mm (while still maintaining known distance 9; that is, sensors 1 and 2 remain at a distance of 15 mm from each other). The table reports the erroneous value for the electric current in the conductor perceived from sensor (or sensor pair) readings, assuming that this 15 mm misplacement is either unknown or incapable of being rectified. For Y=130 mm, one sensor yields a current that is 3.38% lower [=(10,000−9662)/10,000×100%] than the true current, an error that would be regarded as significant in most industrial settings; the corresponding error for two sensors is 0.8%. At Y=230 mm the error for one sensor is a still high 2.1% whereas the error for two sensors is 0.07% which is sufficiently precise for most industrial applications.

The signals from the two sensors, when two sensors are used, can be processed as follows. In this embodiment, signals may be relayed wirelessly to a computer at some distance from the sensors.

The reciprocals of both field measurements are taken and the difference between the reciprocals obtained by simple subtraction. Finally the reciprocal of the result is taken. This final value is only weakly dependent on the distance of the pair from the conductor. In other words the conductor can be misplaced by a reasonable margin or the sensor pair inaccurately placed without jeopardizing the utility of the measured results. Other algorithms might be used to better extract final values from the measurements of the pair but even with the simple algorithm of the lines above, the results are superior to those of one sensor where mispositioning of the conductor or sensor easily results in significant error.

TABLE 2

ERRONEOUS ELECTRICAL CURRENTS DETERMINED BY SENSORS; COMPARISON OF PERFORMANCE OF TWO SENSORS VERSUS ONE SENSOR.

True current is 10,000 amps flowing in a long conductor 150 mm by 150 mm with one sensor placed a distance Y from the centerline on a perpendicular through the center of a face. In the case of two sensors the second is on the same perpendicular but 5 mm further from the conductor. Error created by misplacement of sensor (or conductor) so Y increased by 5 mm.

| Y(mm) | Erroneous current (amps) 1 sensor | Erroneous current (amps) 2 sensors |
|---|---|---|
| 130 | 9662 | 9920 |
| 180 | 9737 | 9970 |
| 230 | 9790 | 9993 |

One example of the reduction of the invention to practice is the use of magnetic sensors for measuring electrical currents in the individual "anode rods" by means of which anodes are suspended into the electrolyte of a Hall-Héroult cell. Details of this embodiment are found in the article "Experiments on Wireless Measurement of Anode Currents in Hall Cells" by D. A. Steingart, J. W. Evans, P. K. Wright and D. Ziegler, pp 333-338 "Light Metals 2008", D. H. DeYoung ed., The Minerals, Metals & Materials Society, Warrendale, Pa. 2008, which article is hereby incorporated by reference in its entirety. The apparatus used in this embodiment employed Moteiv Tmote Skye® wireless transceivers coupled to two Hall effect sensors where know distance 9 was precisely one inch, that is the two sensors were separated from each other by exactly one inch.

The first sensor 1, second sensor 2, and a wireless transceiver (mote 6) were integrated into a polycarbonate box, along with a battery as the power source. The box was placed behind the end of a flexible connection attaching the anode rod to the "anode bus" bringing electrical current to the anode rod. In operation of a Hall-Héroult cell anodes are changed periodically by removing a used anode and its anode rod and replacing it with a new anode and anode rod. The non-contacting nature of the measurement meant that no modifications of anode changing procedures was needed.

Hall effect sensors provide a safe method for obtaining measurements of electrical currents and their fluctuations. The sensors used in this study were effective up to two inches away from the anode rod.

In this study sensors with a sensitivity of one to ten mV/Gauss were successfully employed. There was no difficulty in establishing communication between wireless transceivers and the laptop computer used to record data, placed approximately 150 ft. away from the Hall-Héroult cell under study. The wireless transceivers were unaffected by the strong magnetic field of the cells.

Wireless transceivers and other hardware supplied by other manufacturers can be used in the implementation of the invention.

Note that specific numbers, types, arrangements and other characteristics of devices and systems can vary from those described herein. In general, features of embodiments of the invention can work with any suitable types of wireless transceiver, topology, protocol, physical links, etc. Wireless transceivers can be used to relay information to other wireless transceivers and eventually to a central processing station such as a laptop computer (or other processing system) as will be evident to those skilled in the art.

Although the invention has been discussed with respect to specific embodiments thereof, these embodiments are merely illustrative, and not restrictive, of the invention. Additional types of magnetic field sensors include ones wherein electrical currents are induced by the fluctuating magnetic field of an alternating electrical current (AC). Any type of software applications or functionality can be provided at the wireless transceiver, base station, servers and/or clients. It is anticipated that third-party commercial software can be used to perform functions such as computation of the electrical current from the multiple magnetic field measurements, database storage and retrieval, data transfer, data analysis, operating system functions, etc.

Although embodiments of the invention have been presented primarily with respect to electrochemical production, other uses are possible. Different configurations of sensors, power generators, receivers, transmitters and control systems are possible.

In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown nor described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the Figures can also be implemented in a more separated or integrated manner, or even removed or rendered as inoperable in certain cases, as is useful in accordance with a particular application.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

What is claimed is:

1. A device for determining electrical current in each conductor among a plurality of conductors, over time, comprising:

two sensors for measuring magnetic fields generated by electrical current flowing in each conductor among a plurality of conductors, wherein a first sensor is placed non-contiguous and close enough to a single conductor to measure, over time, the magnetic field generated by the electrical current in the single conductor, thereby yielding a first measurement over time, wherein a second sensor is placed at a known distance from the first sensor, and is placed non-contiguous and close enough to the single conductor to measure, over time, the magnetic field generated by the electrical current in the single conductor, thereby yielding a second measurement over time, a processor that receives the first measurement and the second measurement, wherein the processor calculates the electrical current in each single conductor over time based on the first measurement over time, the second measurement over time, and the known distance.

2. The device of claim 1 wherein said sensors are Hall effect sensors.

3. The device of claim 1 wherein the processor is a mote that processes the first measurement and the second measurement to generate data.

4. The device of claim 3 wherein the processed data is transmitted wirelessly from the mote to a computer, wherein the computer calculates the electrical current in a conductor over time using the first measurement, the second measurement and the known distance.

5. The device of claim 3 wherein the mote calculates the electrical current over time using the first measurement, the second measurement and the known distance.

6. The device of claim 1 wherein the processor is a computer, and wherein the computer calculates the electrical current in a conductor over time using the first measurement, the second measurement and the known distance.

7. The device of claim 6 wherein the first measurement and the second measurement are transmitted wirelessly to the computer.

8. The device of claim 1 wherein at least one conductor is moving while the sensors transmit magnetic field measurements for each single conductor.

9. The device of claim 1 wherein the electrical current is predominantly direct electrical current flowing in an electrolytic cell.

10. The device of claim 9 wherein the electrolytic cell is an alumina reduction cell.

11. The device of claim 9 wherein the electrolytic cell comprises at least one anode that needs changing, and wherein the data collection and electrical current calculation continue during anode changing.

12. A device for determining electrical current in each of a plurality of anode rods carrying electrical current in an alumina reduction cell comprising, a sensor pair mounted noncontiguous and near to each single anode rod in an alumina reduction cell, comprising a first sensor and a second sensor at a known distance from each other, wherein said first sensor and said second sensor measure magnetic fields from a single anode rod, and wherein said first sensor measures and transmits, over time, a magnetic field measurement from said single anode rod, thereby yielding a first measurement over time, said second sensor measures and transmits, over time, a magnetic field measurement of said single anode rod, thereby yielding a second measurement over time, a processor that receives, over time from each sensor pair, said first measurement from said first sensor and said second measurement from said second sensor, wherein said processor processes said first measurement over time, said second measurement over time, and said known distance to determine the electrical current in each single anode rod over time.

13. The device of claim 12 wherein said first measurement and said second measurement are transmitted wirelessly to a wireless transceiver, wherein said wireless transceiver then transmits said measurements to said processor.

14. The device of claim 12 wherein said magnetic field measurements are transmitted, and said processor determines electrical currents of each anode rod, in real time.

15. The device of claim 12 wherein said magnetic field measurements, and said processor determines electrical currents of each anode rod, as at least one anode rod moves.

16. A method for determining the electrical current in each conductor among a plurality of conductor in an electrolytic cell comprising, (a) obtaining a sensor pair that is mounted noncontiguous and near to each conductor, said sensor pair comprising a first sensor and a second sensor at a known distance from each other, wherein said first sensor and said second sensor measure magnetic fields, (b) said first sensor measuring and transmitting over time a magnetic field measurement from a single conductor, thereby yielding a first measurement over time, (c) said second sensor measuring and transmitting over time a magnetic field measurement of said single conductor, thereby yielding a second measurement over time, (d) processing, for each conductor, said first measurement over time, said second measurement over time and said known distance to determine the electrical current in each conductor.

\* \* \* \* \*